United States Patent
Tabata et al.

[11] Patent Number: 5,395,663
[45] Date of Patent: Mar. 7, 1995

[54] PROCESS FOR PRODUCING A PEROVSKITE FILM BY IRRADIATING A TARGET OF THE PEROVSKITE WITH A LASER BEAM AND SIMULTANEOUSLY IRRADIATING THE SUBSTRATE UPON WHICH THE PEROVSKITE IS DEPOSITED WITH A LASER BEAM

[75] Inventors: Hitoshi Tabata, Akashi; Osamu Murata, Kobe; Junzo Fujioka; Shunichi Minakata, both of Akashi; Shichio Kawai, Suita; Tomoji Kawai, Minoo, all of Japan

[73] Assignee: Kawasaki Jukogyo Kabushiki Kaisha, Hyogo, Japan

[21] Appl. No.: 51,817

[22] Filed: Apr. 26, 1993

Related U.S. Application Data

[63] Continuation of Ser. No. 749,726, Aug. 26, 1991, abandoned.

[30] Foreign Application Priority Data

| Aug. 24, 1990 [JP] | Japan | 2-222884 |
| Jun. 18, 1991 [JP] | Japan | 3-077242 |
| Jun. 18, 1991 [JP] | Japan | 3-245292 |
| Jul. 12, 1991 [JP] | Japan | 3-266786 |

[51] Int. Cl.$^6$ .................................. B05D 5/12
[52] U.S. Cl. .................................. 427/554; 427/566; 427/567; 427/100; 427/255.3
[58] Field of Search ............... 427/554, 566, 567, 100, 427/255.3

[56] References Cited

U.S. PATENT DOCUMENTS

| 3,209,087 | 9/1965 | Allen | 427/567 |
| 3,617,375 | 11/1971 | Marek et al. | 427/567 |
| 4,624,736 | 11/1986 | Gee et al. | 427/53.1 |
| 4,663,826 | 5/1987 | Baeuerle | 427/53.1 |
| 4,759,948 | 7/1988 | Hashimoto et al. | 427/567 |
| 4,874,741 | 10/1989 | Shaw et al. | 427/53.1 |
| 4,882,312 | 11/1989 | Mogro-Campero et al. | 427/255.3 |
| 4,902,572 | 2/1990 | Horne et al. | 427/556 |
| 5,047,385 | 9/1991 | Beasley et al. | 427/53.1 |

OTHER PUBLICATIONS

B. D. Cullity, Elements of X-Ray Diffraction, Addison–Wesley, 1978 pp. 32–39.

*Primary Examiner*—Shrive Beck
*Assistant Examiner*—Benjamin L. Utech
*Attorney, Agent, or Firm*—Oliff & Berridge

[57] ABSTRACT

There is provided a process for producing a dielectric thin film of a perovskite oxide on a substrate by a vapor-deposition process which includes vaporizing the oxide and irradiating the oxide vapor or the substrate with a laser beam.

There is also provided a pyroelectric type of sensor comprising: a MOS element including a drain electrode, a source electrode, a gate electrode and an Si semiconductor and a film of a ferroelectric or pyroelectric material formed on the drain electrode, the drain electrode being made of a material which exhibits a good ohmic contact with Si or $SiO_2$ and has a lattice constant close to that of ferroelectric or pyroelectric material.

14 Claims, 10 Drawing Sheets

PROCESS FOR PRODUCING A PEROVSKITE FILM BY IRRADIATING A TARGET OF THE PEROVSKITE WITH A LASER BEAM AND SIMULTANEOUSLY IRRADIATING THE SUBSTRATE UPON WHICH THE PEROVSKITE IS DEPOSITED WITH A LASER BEAM

This is a continuation of application Ser. No. 07/749,726, filed Aug. 26, 1991, now abandoned.

BACKGROUND OF THE INVENTION

1. Field of the Invention

This invention relates generally to the production of dielectric thin films and the application thereof to a specific kind of electronic device. More specifically, this invention relates to a process for producing dielectric thin films by a vapor deposition technique making use of laser beams and a pyroelectric type of sensors including dielectric films produced by such a process.

2. Background Art

So far, thin films of inorganic dielectric materials such as Pb-containing perovskite-type compounds used for sensor head parts, magnetic recording media, etc. have been prepared by magnetron sputtering, radio-frequency (RF) sputtering, chemical vapor deposition (CVD for short) or other vapor-deposition techniques.

However, dielectric thin films obtained by the conventional film-forming techniques are likely to be randomly oriented; when it is intended to obtain crystallized films with c-axis orientation in an as-deposited state, it is required to increase a substrate temperature to 600° C. or higher, which makes it impossible to form them directly on such devices as Si-CCD or MOSFET.

Another problem with the prior art film-forming processes, which are generally carried out at an oxygen pressure as low as 0.01 Torr or less due to restrictions imposed by the equipment used therefor or by the principles thereof, is that at such a low oxygen pressure there are compositional deviations in the deposited films due to a difference in equilibrium vapor pressure between target elements.

It is therefore an object of this invention to provide a process for producing dielectric thin films which are fully oriented with the c-axis even when prepared at a low substrate temperature and so are of high crystallinity.

It is another object of this invention to provide a process for producing dielectric thin films which are free from such compositional deviations as found in the prior art processes.

It is a further object of this invention to provide a pyroelectric type of sensor having on the drain electrode of a MOS element a film of ferroelectric or pyroelectric material which is fully oriented in the c-axis direction and crystallized.

SUMMARY OF THE INVENTION

In accordance with this invention, the above-mentioned objects are achieved by the provision of a process for producing a dielectric thin film of a compound oxide of a high-melting metal and a low-melting metal by vapor-depositing the compound oxide onto a substrate, characterized in that said substrate or the vapor phase is irradiated with a laser beam during vapor deposition.

The process of the present invention makes it possible to produce dielectric thin films, which are well crystallized and fully oriented in the c-axis direction, at such a low substrate temperature as can never be applied in the prior art.

According to this process, the evaporation of the compound oxide is preferably performed by a method of irradiating the compound oxide as a target with laser beams (laser sputtering), because better crystallization is then achievable at a low substrate temperature.

Preferably, the lattice constants of the material to be formed into a film and the substrate material should be made close to each other, because it is then possible to form a well-crystallized dielectric thin film with c-axis orientation at a further lower substrate temperature.

Further, the vapor deposition is preferably carried out in an oxygenous atmosphere with the oxygen partial pressure as high as 0.06 Torr or more, whereby the compositional deviation in the deposited film from the target is effectively prevented.

According to the present invention, there is also provided a pyroelectric type of sensor comprising: a MOS element including a drain electrode, a source electrode, a gate electrode and an Si semiconductor and a film of a ferroelectric or pyroelectric material formed on the drain electrode, said drain electrode being made of a material which exhibits a good ohmic contact with Si or $SiO_2$ and has a lattice constant close to that of said ferroelectric or pyroelectric material.

In this pyroelectric type of sensor, the film of a ferroelectric or pyroelectric material is preferably one which is prepared by a process comprising irradiating a laser beam onto a target consisting of a compound oxide of a high-melting metal and a low-melting metal, thereby to vapor-deposit said compound oxide onto the aforesaid drain electrode. This vapor deposition process is preferably carried out at a partial pressure of oxygen as high as 0.06 torr or more.

The pyroelectric type of sensor of the present invention exhibits a very high performance as a MOS device, because the film of the dielectric or pyroelectric material on the drain electrode is fully oriented with the c-axis and so of high crystallinity, and is obtainable at a temperature as low as, say, 400° C. or below.

DETAILED DESCRIPTION OF THE INVENTION

I. Production of Dielectric Thin Film

Figure 1:
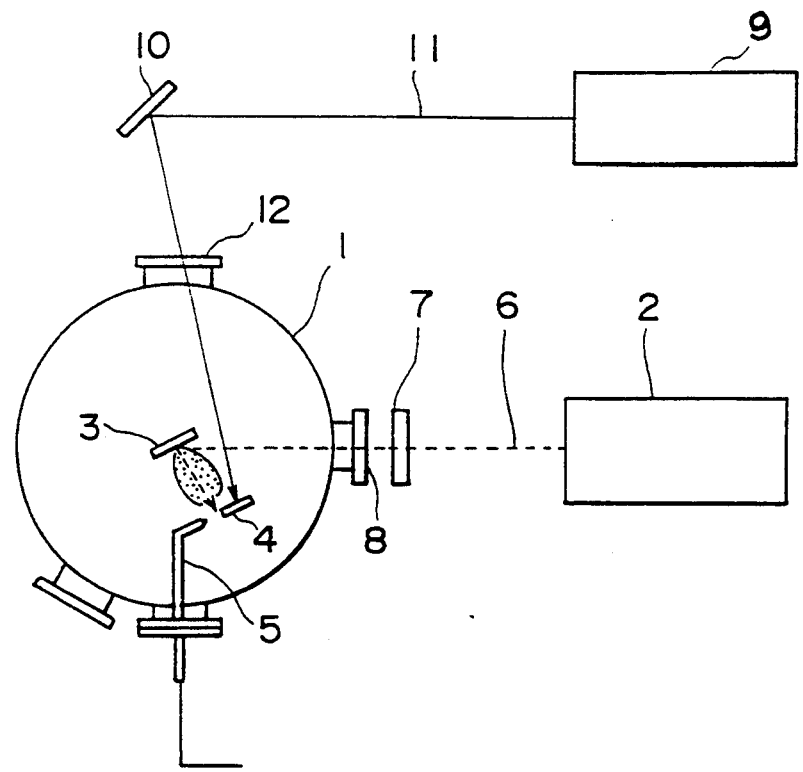
FIG. 1 is a diagrammatical sketch showing one example of an equipment for carrying out the process for producing dielectric thin films according to this invention.

The dielectric (pyroelectric, ferroelectric or piezoelectric) thin film to be produced by the present inventive process is made of a compound oxide of a high-melting metal and a low-melting metal. Specific examples of such compound oxides may include $Pb(Zr, Ti)O_3$, $(Pb, La)(Zr, Ti)O_3$, $(Pb, La)TiO_3$, $LiTaO_3$, $BaTiO_3$ and $LiNbO_3$.

Preferably but not exclusively, the substrate on which the dielectric thin film is to be formed is made of a material with the lattice constant close to that of the material of the film in order to obtain a crystallized film with c-axis orientation even at a low substrate temperature. Thus, it is preferred to use a substrate with the lattice constant differing from that of the film-forming material by preferably at most 10%, more preferably at most 3%. Such a substrate, for instance, may be made of MgO, $SrTiO_3$, Pt, Pd, Ag, In, $SNO_2$, PbO, $V_2O_3$, $Fe_2O_3$, $Nb_2O_5$, $RuO_2$, $ReO_3$, $IrO_3$, $TiO_2$, $Bi_2O_3+W$ dopant and $SiTiO_3+Nb$ dopant, when the above exemplified compound oxides are used as a film-forming material.

In this connection, it is to be noted that where it is impossible to use a substrate whose lattice constant is close to that of the film-forming material, a reduction in the film-forming temperature can be achieved by forming an intermediate layer between the film and the substrate so as to make up for the mismatch of lattice constant. The intermediate layer is preferably formed of an electrically conductive or dielectric material of a cubic or tetragonal structure which has a lattice constant lying between those of the film and the substrate.

In accordance with the present invention, the vapor deposition of the above-mentioned compound oxide onto the substrate to form a thin film may be achieved by any desired vapor deposition techniques known so far in the art, for instance, magnetron sputtering, radio-frequency sputtering, CVD, molecular beam epitaxy and electron beam methods. In view of producing crystallized films at a low substrate temperature, however, it is preferred that film-forming be carried out by the so-called laser sputtering process in which the compound oxide target is irradiated with a laser beam to evaporate said material, and the evaporated material is then deposited onto the substrate to form a thin film substantially identical in composition with the target. The vapor deposition by laser sputtering enables a higher energy to be applied to atoms to be accumulated on the substrate, as compared with the other deposition processes, rendering it possible to obtain a crystallized film fully oriented with the c-axis even when the substrate temperature during film formation is lower than applied heretofore.

For the vapor deposition by laser sputtering, the laser beam applied to the target should preferably be one which has high energy per photon. For example, use may be made of ArF excimer laser (wavelength: 193 nm); $K_2F$ laser (249 nm); XeCl laser (308 nm); XeF laser (351 nm); and ultraviolet lasers such as YAG-THG (355 nm), among which preference is given to ArF excimer laser. The intensity of laser applied to the target is preferably about 0.5 to 3 $J/cm^2$, more preferably about 1 $J/cm^2$. At less than 0.5 $J/cm^2$ there occurs a compositional deviation and degradation of crystallinity, whereas at higher than 3 $J/cm^2$ there is degradation of film quality. Preferably, the repetition frequency of laser lies in the range of about 10 to 50 Hz.

According to the present invention, either the substrate or the vapor phase is irradiated with a laser beam in the process of the vapor deposition of the compound oxide onto the substrate. The laser beam used to this end is preferably equal or higher in the efficiency of absorption by the compound oxide or vapor phase to or than the laser beam applied to the target in the vapor deposition by laser sputtering. For instance, use is preferably made of ArF excimer laser for the vapor deposition in an atmosphere of $N_2O$ gas; KrF excimer laser (wavelength: 249 nm) in $O_3$ gas; and XeCl laser (308 nm) or XeF laser (351 nm) in $NO_2$ gas. Moreover, the laser beams applied to the substrate or vapor phase should preferably have a lower intensity than those applied to the target; or lies in the intensity range of preferably about 10 to 80 $mJ/cm^2$, most preferably about 30 to 50 $mJ/cm^2$. Furthermore, the laser beams should preferably have a repetition frequency of 10 to 200 Hz, preferably 100 to 200 Hz. For the irradiation of laser beam to the substrate or vapor phase, it is important to take the timing of irradiation so as to ensure an effective irradiation onto the vaporized material produced by the laser irradiation onto the target.

According to the present invention, the dielectric film is formed by vapor deposition in an oxidizing gas atmosphere serving as an oxygen supply source for the film, for instance, in an atmosphere of $O_2$, $O_3$, $NO_2$ or $N_2O$ gas. When the film deposition is conducted in an atmosphere of $O_2$, it is preferred to apply a partial pressure of oxygen of 0.06 Torr or higher, preferably 0.1 Torr or higher. By carrying out vapor deposition at such a high partial pressure of oxygen, it is possible to prevent a compositional deviation (esp., a deviation of the low-melting element) effectively.

Illustrative examples of the process for producing dielectric thin films according to the present invention will now be explained at great length with reference to the accompanying drawings.

Figure 2A:
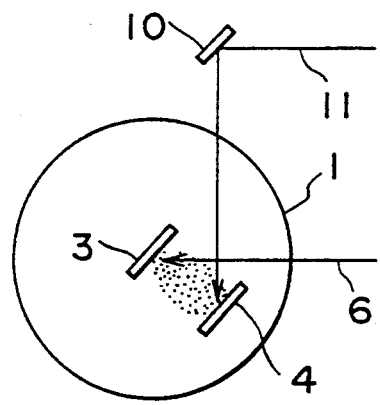
FIG. 2 is diagrammatical sketches illustrating how the substrate (FIG. 2A) and vapor phase (FIG. 2B) are irradiated with laser beams, respectively.
Figure 2B:
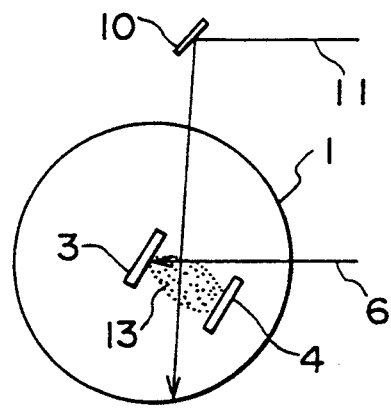

Referring to FIG. 1, there is shown a general arrangement of an equipment for carrying out the present invention, wherein reference numeral 1 represents a film-forming vessel (vacuum chamber), 2 a laser oscillator, 3 a target, 4 a substrate and 5 an oxygen gas feed line. The laser oscillator 2 is designed to generate an ArF excimer laser (193 nm) 6, which is in turn directed to the target 3 through a lens 7 and a laser guide port 8 provided in the film-forming vessel 1. Evaporated materials coming out of the target 3 are then deposited onto the substrate 4 located opposite to the target, thereby forming a film. This film-forming equipment is characterized in that the energy (laser) source 2 is spaced away from the film-forming chamber (vacuum chamber) 1, thus making it possible to form a film over a wide range of gas pressures ($10^{-10}$ Torr to normal pressure). In FIG. 1, reference numerals 9 and 10 stand for another laser oscillator and a mirror, respectively. A laser beam 11 generated from the laser oscillator 9 is reflected off the mirror 10 and introduced from another laser guide port 12 into the vacuum chamber 1. In this case, the laser beam 11 may be directed to the substrate 4 as shown in FIG. 2A or a vapor phase 13 as shown in FIG. 2B by regulating the angle of the mirror 10.

EXAMPLE 1

Figure 3:
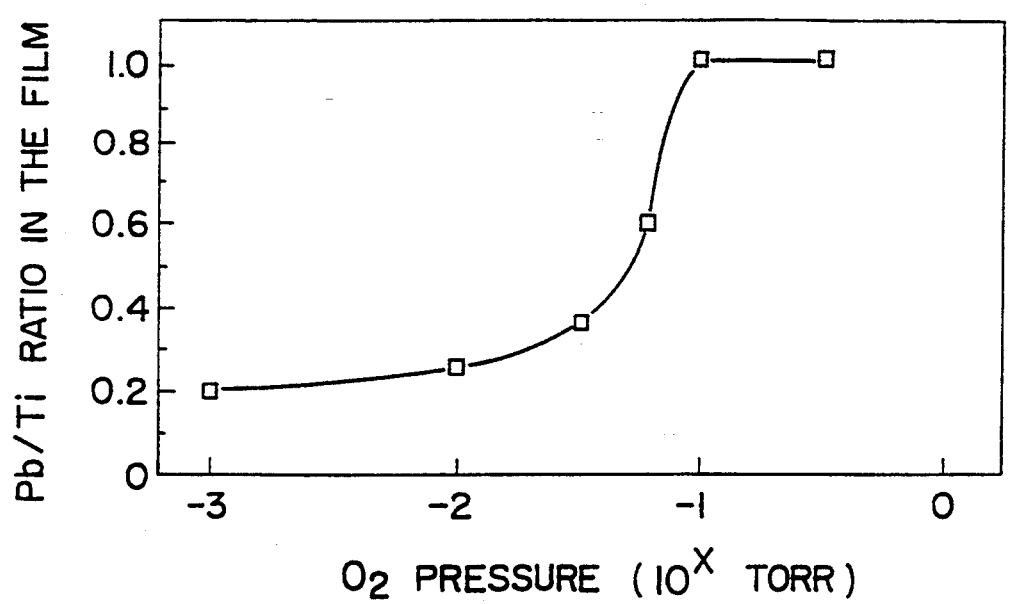
FIG. 3 is a graph illustrating the relation between the partial pressure of oxygen during film formation and the Pb/Ti ratio in the $PbTiO_3$ thin film obtained in Example 1.

Laser intensity: 1 J/cm$^2$
Repetition frequency: 15 Hz
Substrate: MgO
Substrate temperature (Ts): 550° C.
Target: PbTiO$_3$ Under the above-mentioned film-forming conditions, thin films were prepared at varied partial pressures of oxygen (0.1 Torr, 0.01 Torr and 0.001 Torr) and measured for their Pb contents. The results are shown in FIG. 3, from which it is understood that in order to prevent a compositional deviation from the target (esp., a deviation of the low-melting metal), the film should be formed at a partial pressure of oxygen of at least 0.06 torr, preferably at least 0.1 Torr.

Figure 4A:
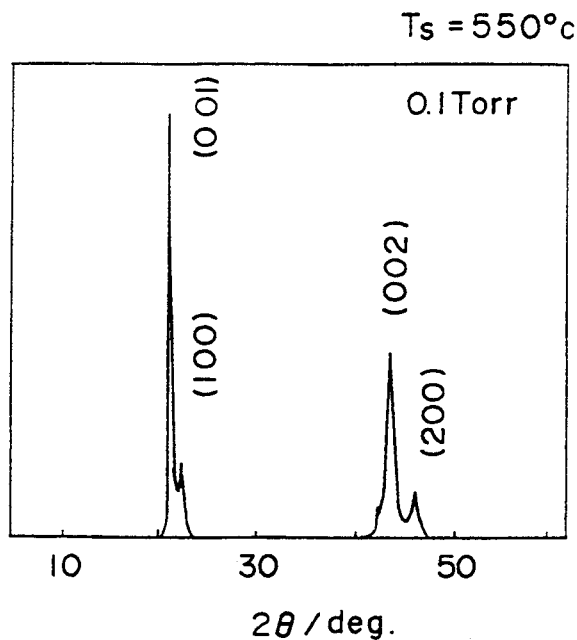
FIGS. 4, 5, 6, 7, 8, 9 and 10 are X-ray diffraction pattern diagrams of the $PbTiO_3$ thin films obtained in the Examples.
Figure 4B:
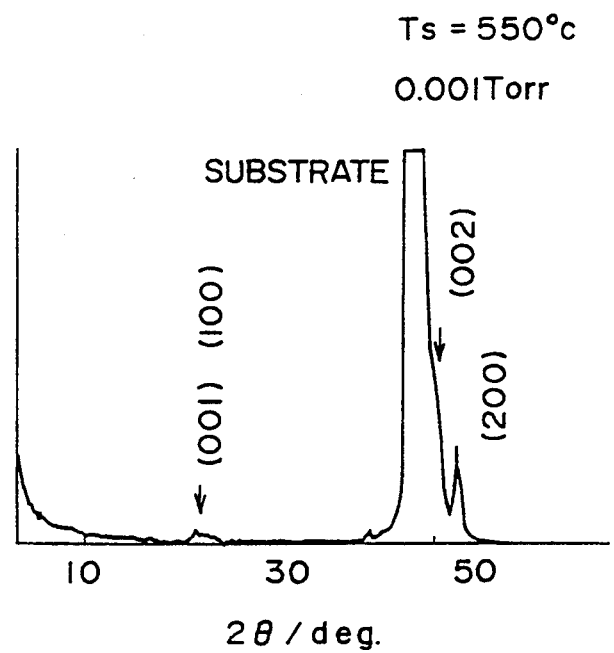

The X-ray diffraction patterns of the PbTiO$_3$ thin films obtained at the partial pressures of oxygen of 0.1 Torr and 0.001 Torr are shown in FIG. 4A and 4B, respectively. As can be seen from FIG. 4B, the X-ray intensities of the indices (001) and (002) to the c-axis orientation are both low; it is impossible to form well-crystallized thin films due to a compositional deviation at a low partial pressure of oxygen.

EXAMPLE 2

Figure 5A:
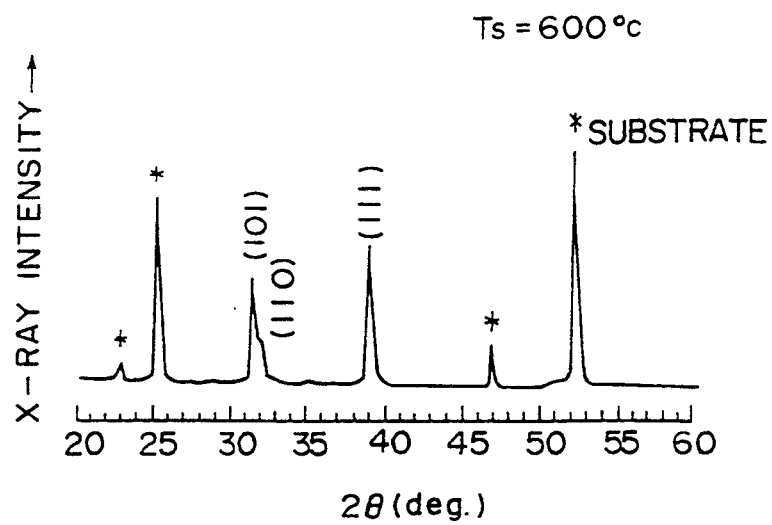
Figure 5B:
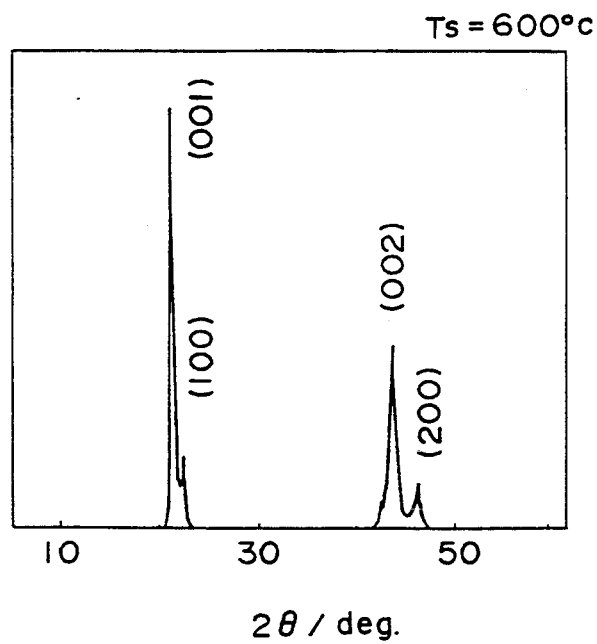

The X-ray diffraction patterns of a dielectric thin film (PbTiO$_3$) prepared by a conventional film-forming technique (magnetron sputtering conducted with an MgO substrate at a substrate temperature of 600° C. and a partial pressure of oxygen of 0.01 Torr) and a thin film prepared by laser sputtering are shown in FIGS. 5A and 5B, respectively. As can be seen from FIG. 5B, the thin film prepared by laser sputtering is so strongly oriented in the c-axis direction that it can be expected to have high electrical properties. As illustrated in FIG. 5A, however, the dielectric thin film prepared by the conventional film-forming technique is oriented so randomly that it cannot be expected to have high electrical properties. Thus, the laser sputtering technique, because of higher energy per photon, makes it possible to apply higher energy to the accumulated atoms, yielding a crystallized film that is well oriented in the c-axis direction. In this example, the conditions for laser sputtering are the same as in Example 1 except for the substrate temperature of 600° C. (the partial pressure of oxygen: 0.1 Torr).

EXAMPLE 3

Figure 6A:
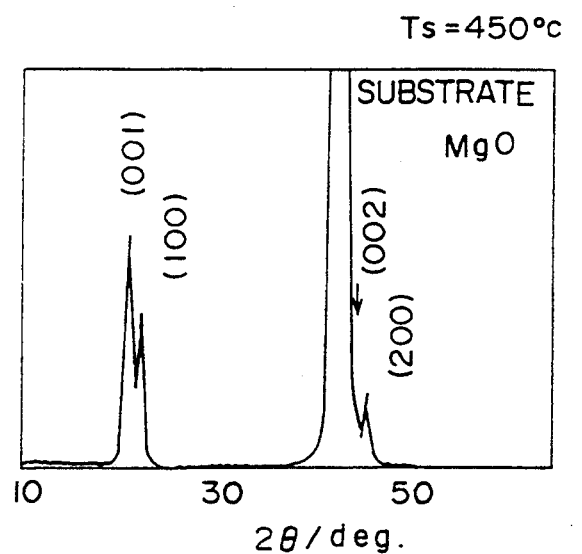
Figure 6B:
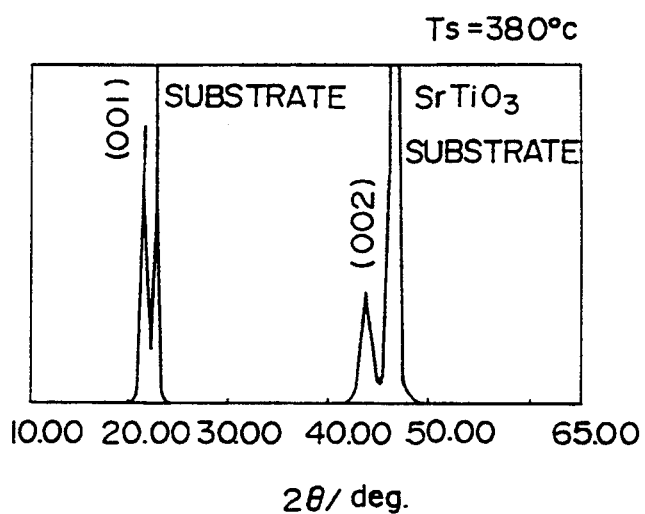

In this example, a substrate having a lattice constant close to that of the material to be formed into a film was chosen. Thus, MgO (with a lattice constant of 4.20 Å) and SrTiO$_3$ (3.91 Å) were used as the substrate to form PbTiO$_3$ (3.90 Å) into a film—see FIGS. 6A and 6B. With the SrTiO$_3$ substrate well-matched in the lattice constant with PbTiO$_3$, it was possible to prepare a well-crystallized PbTiO$_3$ thin film with c-axis orientation even at a substrate temperature (380° C.) about 100° C. lower than is the case with the MgO substrate—see FIG. 6B. The film-forming conditions are mentioned below.

Laser intensity: 1 J/cm$^2$
Repetition frequency: 15 Hz
Substrate temperature (Ts): 380° C., 450° C.
Partial pressure of oxygen: 10$^{-1}$ Torr
Target: PbTiO$_3$ Then, reference will be made to some examples wherein the laser beam 11 is irradiated on the substrate 4.

EXAMPLE 4

Laser intensity: 1 J/cm$^2$
Repetition frequency: 15 Hz
Substrate: SrTiO$_3$
Substrate temperature (Ts): 380° C.
Target: PbTiO$_3$
Gas pressure: 0.1 Torr (O$_2$)
Laser for the substrate: ArF excimer laser (10 mJ/cm$^2$).

EXAMPLE 5

Laser intensity: 1 J/cm$^2$
Repetition frequency: 15 Hz
Substrate: SrTiO$_3$
Substrate temperature (Ts): 380° C.
Target: PbTiO$_3$
Gas pressure: 0.1 Torr (O$_2$)
Laser for the substrate: not used

EXAMPLE 6

Figure 7:
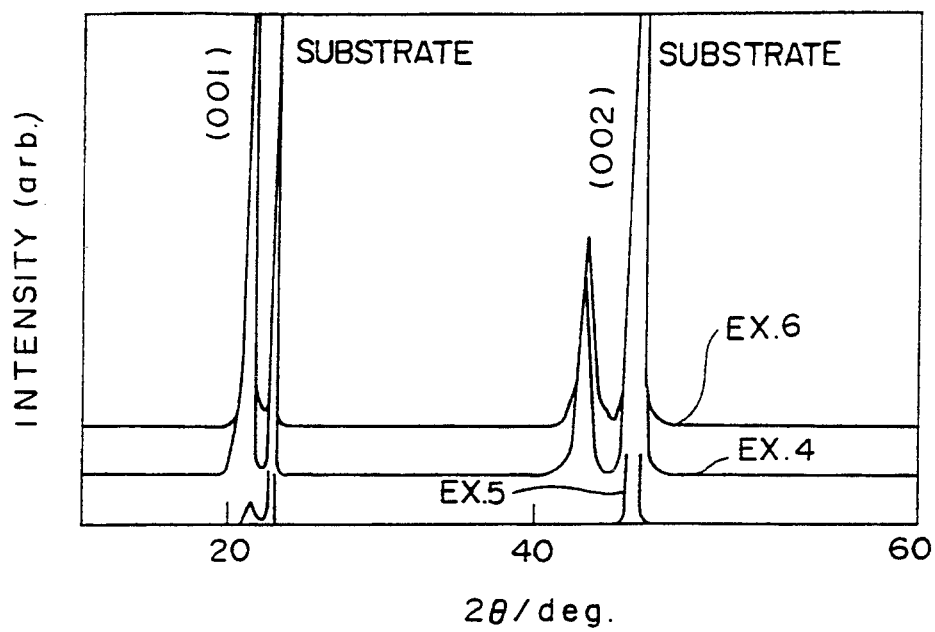

Laser intensity: 1 J/cm$^2$
Repetition frequency: 15 Hz
Substrate: SrTiO$_3$
Substrate temperature (Ts): 450° C.
Target: PbTiO$_3$
Gas pressure: 0.1 Torr (O$_2$)
Laser for the substrate: not used The X-ray diffraction patterns of the PbTiO$_3$ thin films prepared in Examples 4–6 are shown in FIG. 7, which reveals that when the substrate temperature (Ts) is low (380° C.), the X-ray intensities of the indices (001) and (002) to the c-axis orientation are high when the substrate 4 is irradiated with laser (Example 4), so that a crystallized thin film can be formed, but no crystallized thin film can be obtained unless the substrate 4 is irradiated with laser (Example 5). It is also noted that when it is intended to obtain a crystallized thin film without resorting to the irradiation of the substrate 4 with laser (Example 6), it is required to make the substrate temperature (Ts) about 70° C. higher than the case of Example 4.

Reference will now be made to the influence of the intensity of the laser to be irradiated on the substrate.

EXAMPLE 7

Figure 8:
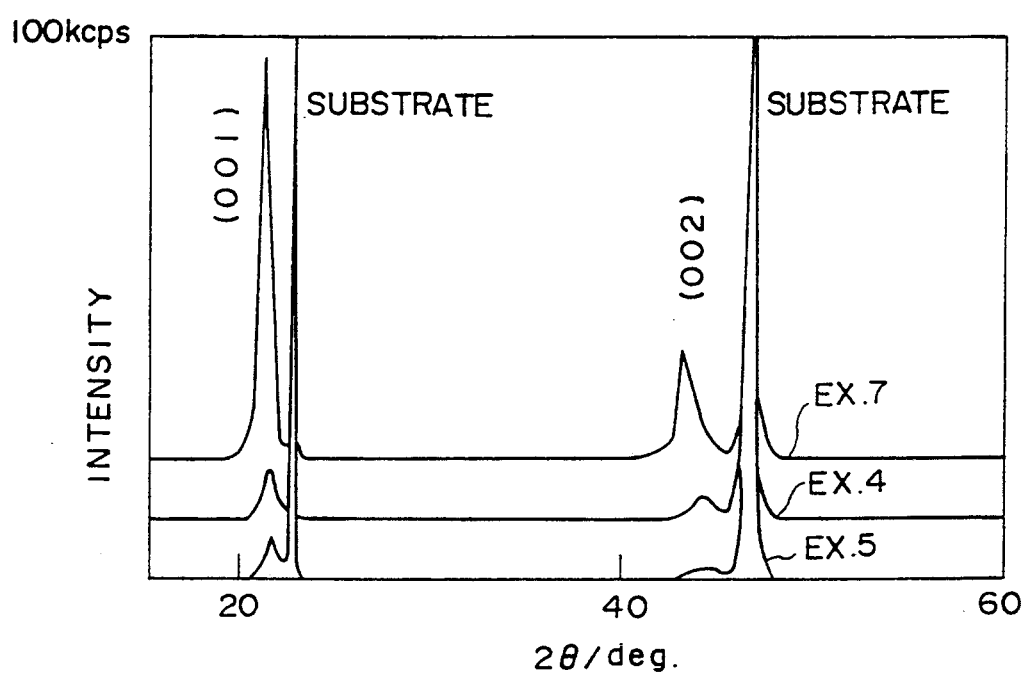

Laser intensity: 1 J/cm$^2$
Repetition frequency: 15 Hz
Substrate: SrTiO$_3$
Substrate temperature (Ts): 380° C.
Target: PbTiO$_3$
Gas pressure: 0.1 Torr (O$_2$)
Laser for the substrate: ArF excimer laser
Laser intensity: 30 mJ/cm$^2$ The X-ray diffraction pattern of the obtained PbTiO$_3$ thin film is shown in FIG. 8 together with those of the thin films obtained in Example 4 (the intensity of the laser for the substrate: 10 mJ/cm$^2$) and Example 5 (no laser for the substrate). As can be seen from FIG. 8, an increase in the intensity of the laser for the substrate results in an improvement in crystallinity.

EXAMPLE 8

Laser intensity: 1 J/cm$^2$
Repetition frequency: 15 Hz

Figure 9:
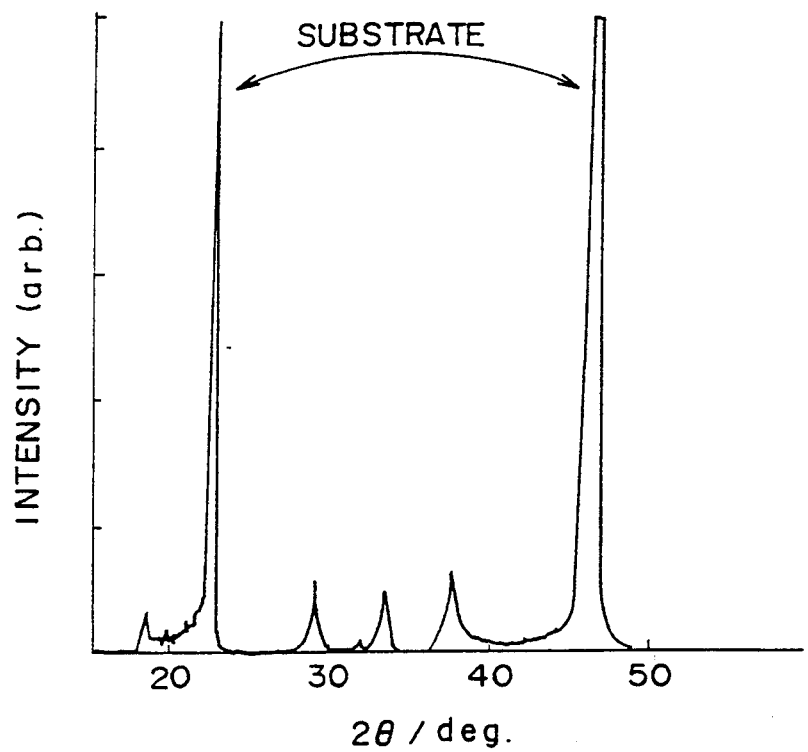

Substrate: SrTiO$_3$
Substrate temperature (Ts): 380° C.
Target: PbTiO$_3$
Gas pressure: 0.1 Torr (O$_2$)
Laser for the substrate:
Laser intensity: 80 mJ/cm$^2$ When the intensity of laser irradiated onto the substrate is in excess as is the case with this example, the resulting film is likely to degrade due to its re-evaporation, etc., as can be seen from the X-ray diffraction pattern shown in FIG. 9. The degradation of film was clearly found by SEM imaging as well.

Reference will now be made to an example wherein the vapor phase 13 is irradiated with a laser beam, as illustrated in FIG. 2B.

EXAMPLE 9

Figure 10:
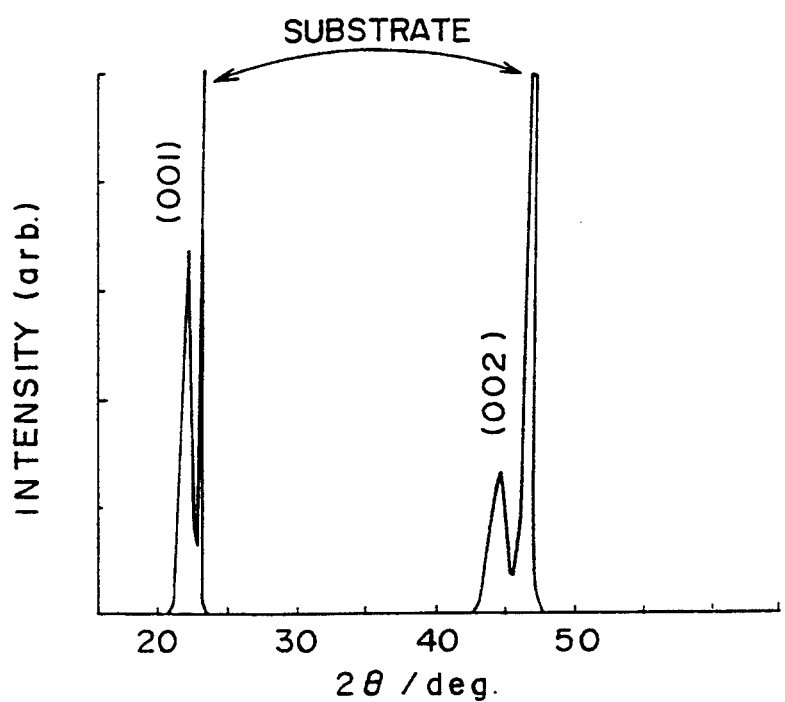

Laser intensity: 1 J/cm$^2$
Repetition frequency: 15 Hz
Substrate: SrTiO$_3$
Substrate temperature (Ts): 400° C.
Target: PbTiO$_3$
Gas pressure: 0.1 Torr (O$_2$)
Laser for the vapor phase: ArF excimer laser
Laser intensity: 30 mJ/cm$^2$ The X-ray diffraction pattern of the PbTiO$_3$ thin film obtained in this example is shown in FIG. 10, which indicates that a sufficiently crystallized thin film has been obtained.

II. Pyroelectric Type of Sensor

Figure 15:
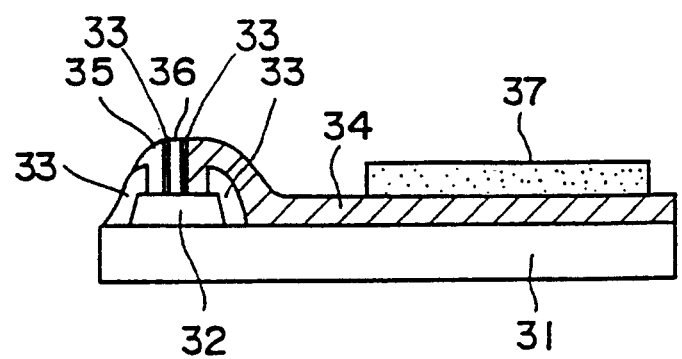
FIG. 15 is a sectional view, centrally and longitudinally sectioned, of one example of a liquid crystal display in which a MOS element is used.

One example of a display element making use of a MOS field effect transistor (FET) comprising a combination of a metal, an oxide insulating film and a semiconductor is illustrated in FIG. 15, wherein reference numeral 31 represents a transparent substrate formed of, e.g. quartz or glass, 32 a P-type Si semiconductor, 33 SiO$_2$, 34 a drain electrode, 35 a source electrode and 36 a gate electrode. In this case, the drain electrode 34 is made of amorphous ITO (indium oxide doped with tin), and has thereon a liquid crystal 37.

When it is intended to construct a pyroelectric type of image sensor making use of such an element structure as mentioned above, it is envisaged to replace the liquid crystal 37 by a pyroelectric film 27 such as PbTiO$_3$ and form the film directly on the drain electrode 34. The production of image sensors with film-forming techniques is set forth in Japanese Patent Kokai Publication No. 2(1990)-280373.

It is expected, however, that the direct formation of pyroelectric film on the drain electrode 34 offers the following problem: although it is required to form a film at a considerably low temperature in order to prevent thermal diffusion of a dopant doped to the Si semiconductor and losses of Al wirings due to fusion, yet difficulty is involved in crystallizing the pyroelectric film 27 formed on the amorphous ITO 37 at such a low temperature.

According to the present invention, the above-mentioned problem can be solved by constructing the drain electrode from a material that exhibits good ohmic contact with Si or SiO$_2$ and has a lattice constant close to that of the ferroelectric or pyroelectric material lying on the drain electrode in the form of a film.

According to one preferable example of the pyroelectric sensor of the present invention, the drain electrode is made of at least two kinds of materials: the part of the drain electrode connected to the Si semiconductor is made of a material that exhibits a good ohmic contact with Si or SiO$_2$, e.g. Al, and the other part onto which a film of a ferroelectric or pyroelectric material such as PbTiO$_3$ is to be formed is made of a material that has a lattice constant close to that of the film material, e.g. Pt.

The difference in the lattice constant between the material of the drain electrode onto which a film of ferroelectric or pyroelectric material is to be formed and the ferroelectric or pyroelectric material is preferably at most 10%, more preferably at most 3%.

In the pyroelectric type of sensor according to the present invention, the film of ferroelectric or pyroelectric material on the drain electrode is preferably obtained by a process wherein a target comprising a compound oxide of a high-melting metal and a low-melting metal is irradiated with a laser beam to vapor-deposit the compound oxide onto the drain electrode. In this case, the vapor deposition is preferably carried out in an oxygenous atmosphere having a partial pressure of oxygen of 0.06 Torr or more.

One illustrative example of the pyroelectric type of sensor according to the present invention will now be explained in detail with reference to FIGS. 11 to 13.

Figure 11:
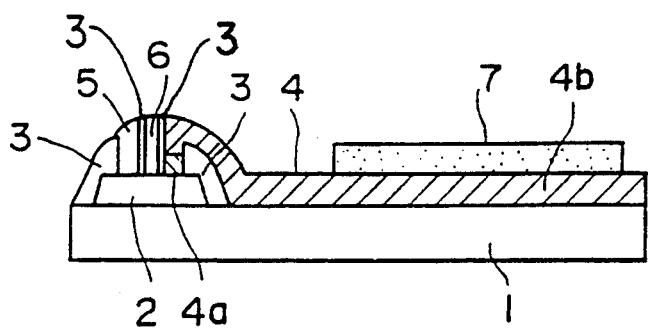
FIG. 11 is a sectional view, centrally and longitudinally sectioned, of one illustrative example of the pyroelectric type of sensor according to this invention.
Figure 12:
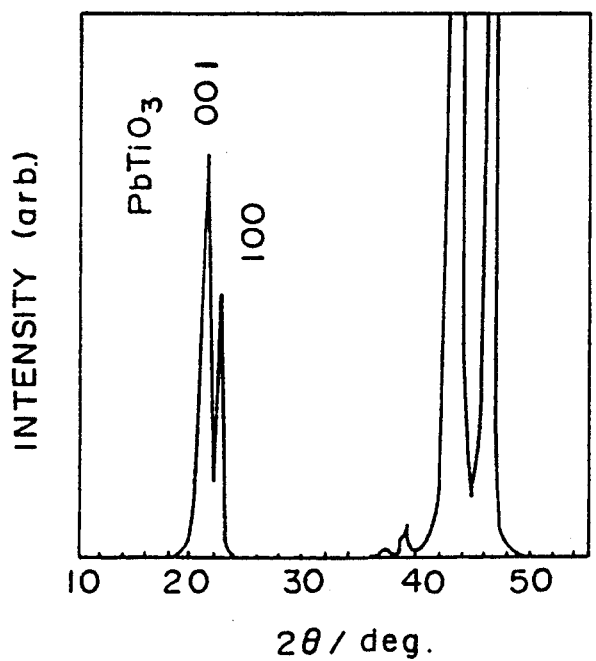
FIG. 12 is an X-ray diffraction pattern diagram of a $PbTiO_3$ film formed on a Pt drain electrode.

In FIG. 11, reference numeral 1 stands for a substrate, 2 a P- (or n-) type Si semiconductor, 3 SiO$_2$, 4 a drain electrode, 5 a source electrode, 6 a gate electrode and 7 a pyroelectric film. In this case, the drain electrode 4 is made of aluminum in the vicinity 4a of the junction with the Si semiconductor 2, and the rest 4b is made of platinum. On the region 4b of Pt there is formed a pyroelectric film 7 of PbTiO$_3$. The purpose of forming the region 4a—adjacent to the junction with the Si semiconductor 2—of aluminum is to ensure ohmic contact (non-rectification contact) with Si or SiO$_2$, and the reason for forming the rest region 4b of platinum is that platinum exhibits a good electrical connection to aluminum and has a lattice constant close to that of the pyroelectric film 7 (PbTiO$_3$). In this connection, it is noted that the lattice constant of platinum is 3.90 Å, whereas that of PbTiO$_3$ is 3.91 Å.

The pyroelectric film 7 is prepared by irradiating a target in a vacuum chamber with a laser beam (ArF excimer laser (wavelength: 193 nm)) and vapor-depositing the evaporated material driven out of the target onto the drain electrode 4 which is located within the vacuum chamber in face-to-face relation to the target. The typical film-forming conditions to be applied in this case are as follows.

Laser intensity: 1–3 J/cm$^2$
Repetition frequency: 5–30 Hz
Electrode temperature: 400° C.
Partial pressure of oxygen: ca. 0.1 Torr
Target: PbTiO$_3$ The X-ray diffraction pattern of the thus obtained PbTiO$_3$ thin film in the as-deposited state is shown in FIG. 12, from which it is confirmed that the X-ray intensity of the index (001) to the c-axial orientation is high, indicating the formation of a crystallized film well oriented with the c-axis. In this case, the drain electrode 4 and the PbTiO$_3$ film 7 are each of a thickness of the order of a few μm.

Figure 13:
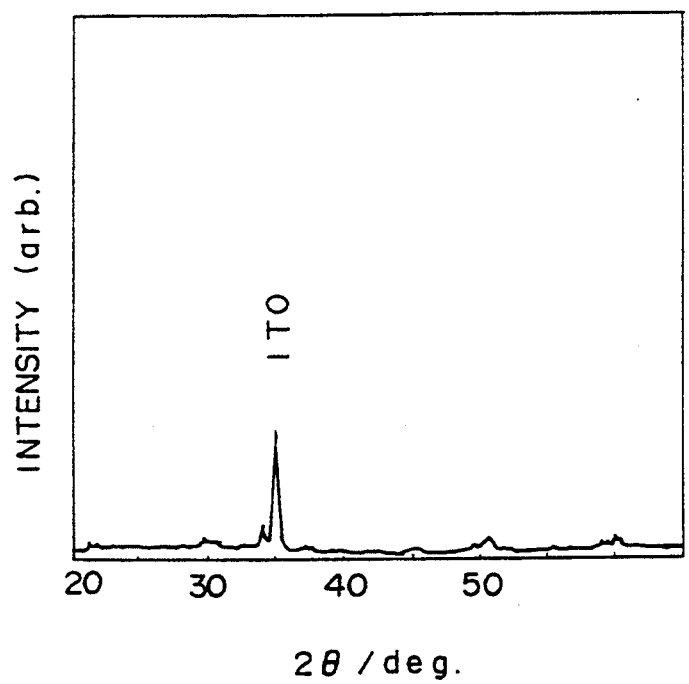
FIG. 13 is an X-ray diffraction pattern diagram of a $PbTiO_3$ film formed on an amorphous ITO drain electrode.
Figure 14:
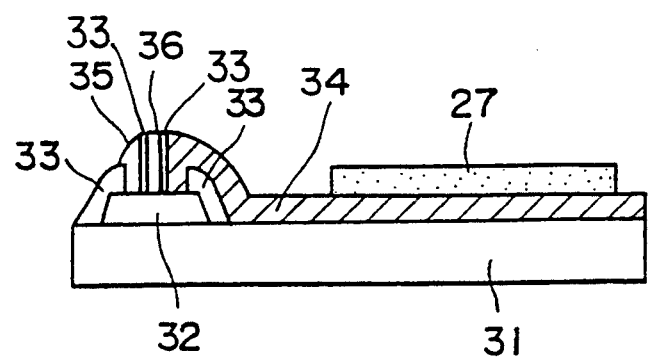
FIG. 14 is a sectional view, centrally and longitudinally sectioned, of one example of the conventional pyroelectric type of sensor utilizing a MOS element.

By contrast, the PbTiO$_3$ film formed on the conventional amorphous ITO under the same conditions as stated above was not crystallized, as can be seen from the X-ray diffraction pattern of FIG. 13, and this indicates that a further increase in the film-forming temperature is needed for crystallization.

The drain electrode 4 has been described as being formed of Al in the vicinity 4a of the junction with the Si semiconductor 1, but this region may be formed of Au. While the rest 4b has been described as being made of Pt, it may be made of Pd, Ag, $SnO_2$, PbO, $SrTiO_3$ doped with niobium, Pb, In, $V_2O_3$, $Fe_2O_3$, $Fe_2O_3$, $Nb_2O_5$, $RuO_2$, $ReO_3$, $IrO_2$, $TiO_2$, $Bi_2O_3$+W dopant, by way of example alone. In addition, the pyroelectric film 7 may be formed of a ferroelectric material or, in some cases, of materials other than $PbTiO_3$, for instance, $BaTiO_3$, $LiTaO_3$ and $LiNbO_3$. In short, the film 7 may be formed of a material whose lattice constant is close to that of the region 4b of the drain electrode 4 on which the film is to be formed. While the drain electrode 4 has been described as being made of two metals, it may be made of a single metal, as the case may be.

While the present invention has been described in the application to a MOS-FET, it may almost equally be applied to a MOS-CCD.

What is claimed is:

1. A process for producing a dielectric film of a perovskite oxide by vapor-depositing the oxide onto a substrate, comprising effecting the vapor deposition by irradiating the oxide as a target with a laser beam and irradiating another laser beam onto the substrate during vapor deposition.

2. A process as claimed in claim 1, wherein the laser beam to be irradiated onto the substrate has a lower energy than the laser beam to be irradiated on the target.

3. A process as claimed in claim 2, wherein the efficiency of absorption by the compound oxide of the laser beam irradiated onto the substrate is equivalent to or higher than the efficiency of absorption by the compound oxide of the laser beam to be irradiated onto the target.

4. The process of claim 3, wherein the perovskite oxide is selected from the group consisting of Pb (Zr, Ti)$O_3$, (Pb, La) (Zr, Ti)$O_3$, (Pb, La) $TiO_3$, $LiTaO_3$, $BaTiO_3$ and $LiNbO_3$.

5. A process as claimed in claim 1, wherein the laser beam to be irradiated onto the target has an intensity of 0.5 to 3 J/cm$^2$, and the laser beam to be irradiated onto the substrate has an intensity of 10 to 80 mJ/cm$^2$.

6. A process as claimed in claim 1, wherein the laser beam to be irradiated onto the target is an ArF excimer laser having a wavelength of 193 nm.

7. A process as claimed in claim 1, wherein the vapor deposition is carried out in an oxygenous atmosphere with a partial pressure of oxygen of 0.06 Torr or more.

8. A process as claimed in claim 1, wherein between the substrate and the dielectric film there is interposed an electrically conductive or dielectric intermediate layer having a lattice constant lying between those of said substrate and said dielectric film and being of a cubic or tetragonal structure.

9. The process of claim 1 wherein the perovskite oxide is selected from the group consisting of Pb (Zr, Ti)$O_3$, (Pb, La) (Zr, Ti)$O_3$, (Pb, La) $TiO_3$, $LiTaO_3$, $BatiO_3$ and $LiNbO_3$.

10. A process for producing a dielectric film of a perovskite oxide by vapor-depositing the oxide onto a substrate, comprising effecting the vapor deposition by irradiating the oxide as a target with a laser beam and irradiating another laser beam to a vapor phase of said oxide, the laser beam to be irradiated to the vapor phase having a lower energy than the laser beam irradiated onto the target.

11. A process as claimed in claim 10, wherein the laser beam irradiated to the vapor phase is characterized by an efficiency of absorption by the vapor phase equivalent to or higher than the efficiency of absorption of the laser beam irradiated onto the target.

12. A process as claimed in claim 10, wherein the laser beam to be irradiated onto the target is an ArF excimer laser having a wave length of 193 nm.

13. A process as claimed in claim 10, wherein the vapor deposition is carried out in oxygenous atmosphere with a partial pressure of oxygen of 0.06 Torr or more.

14. A process as claimed in claim 10, wherein an electrically conductive or dielectric layer of cubic or tetragonal structure having a lattice constant between the lattice constant of the substrate and of the dielectric film is interposed between the substrate and the dielectric film.

* * * * *